(12) United States Patent
Khan et al.

(10) Patent No.: US 11,350,522 B2
(45) Date of Patent: May 31, 2022

(54) MICROWAVE ANTENNA APPARATUS

(71) Applicant: Sony Corporation, Tokyo (JP)

(72) Inventors: Wasif Tanveer Khan, Lahore (PK); Ahmad Waleed, Lahore (PK); Arndt Thomas Ott, Stuttgart (DE); Ramona Hotopan, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 112 days.

(21) Appl. No.: 16/828,968

(22) Filed: Mar. 25, 2020

(65) Prior Publication Data

US 2020/0315001 A1 Oct. 1, 2020

(30) Foreign Application Priority Data

Mar. 26, 2019 (EP) .................... 19165279

(51) Int. Cl.
*H05K 1/02* (2006.01)
*H01Q 15/00* (2006.01)
*H01Q 23/00* (2006.01)
*H01L 23/66* (2006.01)
*H01L 23/00* (2006.01)
*G01S 7/03* (2006.01)

(52) U.S. Cl.
CPC .......... *H05K 1/0236* (2013.01); *H01L 23/66* (2013.01); *H01L 24/13* (2013.01); *H01Q 15/008* (2013.01); *H01Q 23/00* (2013.01); *G01S 7/032* (2013.01); *H01L 2223/6677* (2013.01); *H01L 2224/1623* (2013.01); *H01L 2224/16227* (2013.01)

(58) Field of Classification Search
CPC .... H05K 1/0236; H01Q 15/008; H01Q 23/00; H01Q 1/38; H01Q 21/065; H01L 23/66; H01L 24/13; H01L 2223/6677; H01L 2224/1623; H01L 2224/16227; G01S 7/032
USPC ..................................... 343/700 R
See application file for complete search history.

(56) References Cited

U.S. PATENT DOCUMENTS

| | | | |
|---|---|---|---|
| 8,178,457 B2 | 5/2012 | de Rochemont | |
| 9,553,371 B2 | 1/2017 | MacDonald et al. | |
| 2006/0092079 A1* | 5/2006 | de Rochemont | H01Q 15/006 343/700 MS |
| 2006/0202269 A1* | 9/2006 | Suzuki | H01Q 9/27 257/347 |
| 2011/0102800 A1* | 5/2011 | Bita | G01N 33/18 356/450 |

(Continued)

FOREIGN PATENT DOCUMENTS

WO 2017/167987 A1 10/2017

OTHER PUBLICATIONS

Fischer, A., et al., "77-GHz Multi-Channel Radar Transceiver With Antenna in Package," IEEE Transactions on Antennas and Propagation, vol. 62, No. 3, Mar. 2014, pp. 1386-1394.

(Continued)

*Primary Examiner* — Don P Le
(74) *Attorney, Agent, or Firm* — Xsensus, LLP

(57) ABSTRACT

A microwave antenna apparatus comprises a package module comprising a semiconductor unit, an antenna unit arranged on a first side of the package module and a redistribution layer group arranged on a second side of the package module opposite the first side, and an electromagnetic band gap structure, EBG, module coupled to the redistribution layer group of the package module.

19 Claims, 14 Drawing Sheets

(56) References Cited

U.S. PATENT DOCUMENTS

| | | | | |
|---|---|---|---|---|
| 2011/0148545 | A1* | 6/2011 | Choudhury | H01L 23/66 333/185 |
| 2012/0062346 | A1* | 3/2012 | McKinzie, III | H01P 3/082 333/251 |
| 2012/0236524 | A1* | 9/2012 | Pugh | G02B 1/043 361/783 |
| 2013/0285880 | A1* | 10/2013 | Zaghloul | H01Q 15/006 343/912 |
| 2014/0342679 | A1* | 11/2014 | Choudhury | H01L 23/49822 455/90.2 |
| 2015/0278674 | A1* | 10/2015 | Schoengrundner | H01L 24/49 235/492 |
| 2017/0250457 | A1 | 8/2017 | Murata et al. | |
| 2019/0064338 | A1* | 2/2019 | Holt | G01S 13/426 |
| 2019/0181558 | A1* | 6/2019 | Kakuya | H01Q 13/08 |
| 2020/0335458 | A1* | 10/2020 | Chen | H01L 23/5383 |

OTHER PUBLICATIONS

Fischer, A., et al., "A 77-GHz Antenna in Package," Proceedings of the 8th European Radar Conference, Manchester, UK, Oct. 12-14, 2011, pp. 428-431.

Hamidipour, A., et al., "160-GHz SiGe-Based Transmitter and Receiver With Highly Directional Antennas in Package," Proceedings of the 8th European Microwave Integrated Circuits Conference, Nuremberg, Germany, Oct. 6-8, 2013, pp. 81-84.

Hamidipour, A., et al., "A Rhombic Antenna Array Solution in eWLB Package for Millimeter-Wave Applications," Proceedings of the 42nd European Microwave Conference, Amsterdam, The Netherlands, Oct. 29-Nov. 1, 2012, pp. 205-208.

Hamidipour, A., et al., "Antennas in Package With Stacked Metallization," Proceedings of the 43rd European Microwave Conference, Nuremberg, Germany, Oct. 7-10, 2013, pp. 56-59.

Henawy, M., and Schneider, M., "Integrated Antennas in eWLB Packages for 77 GHz and 79 GHz Automotive Radar Sensors," Proceedings of the 8th European Radar Conference, Manchester, UK, Oct. 12-14, 2011, pp. 424-427.

Pourmousavi, M., et al., "Antenna Design and Characterization for a 61 GHz Transceiver in eWLB Package," Proceedings of the 43rd European Microwave Conference, Nuremberg, Germany, Oct. 7-10, 2013, pp. 1415-1418.

Seler, E., et al., "Chip-to-Rectangular Waveguide Transition Realized in embedded Wafer Level Ball Grid Array (eWLB) Package," Proceedings of 64th Electronic Components and Technology Conference (ECTC), Orlando, FL, USA, May 2014, 4 pages.

Tong, Z., et al., "Wideband Differential Antenna in Package with Superstrate Structure at 77GHz," IEEE Asia-Pacific Conference on Antennas and Propagation, Singapore, Aug. 27-29, 2012, 4 pages.

Wojnowski, M., et al., "Embedded Wafer Level Ball Grid Array (eWLB) Technology for Millimeter-Wave Applications," Proceedings of IEEE 13th Electronics Packaging Technology Conference (EPTC2011), Singapore, Dec. 2011, pp. 423-429.

* cited by examiner

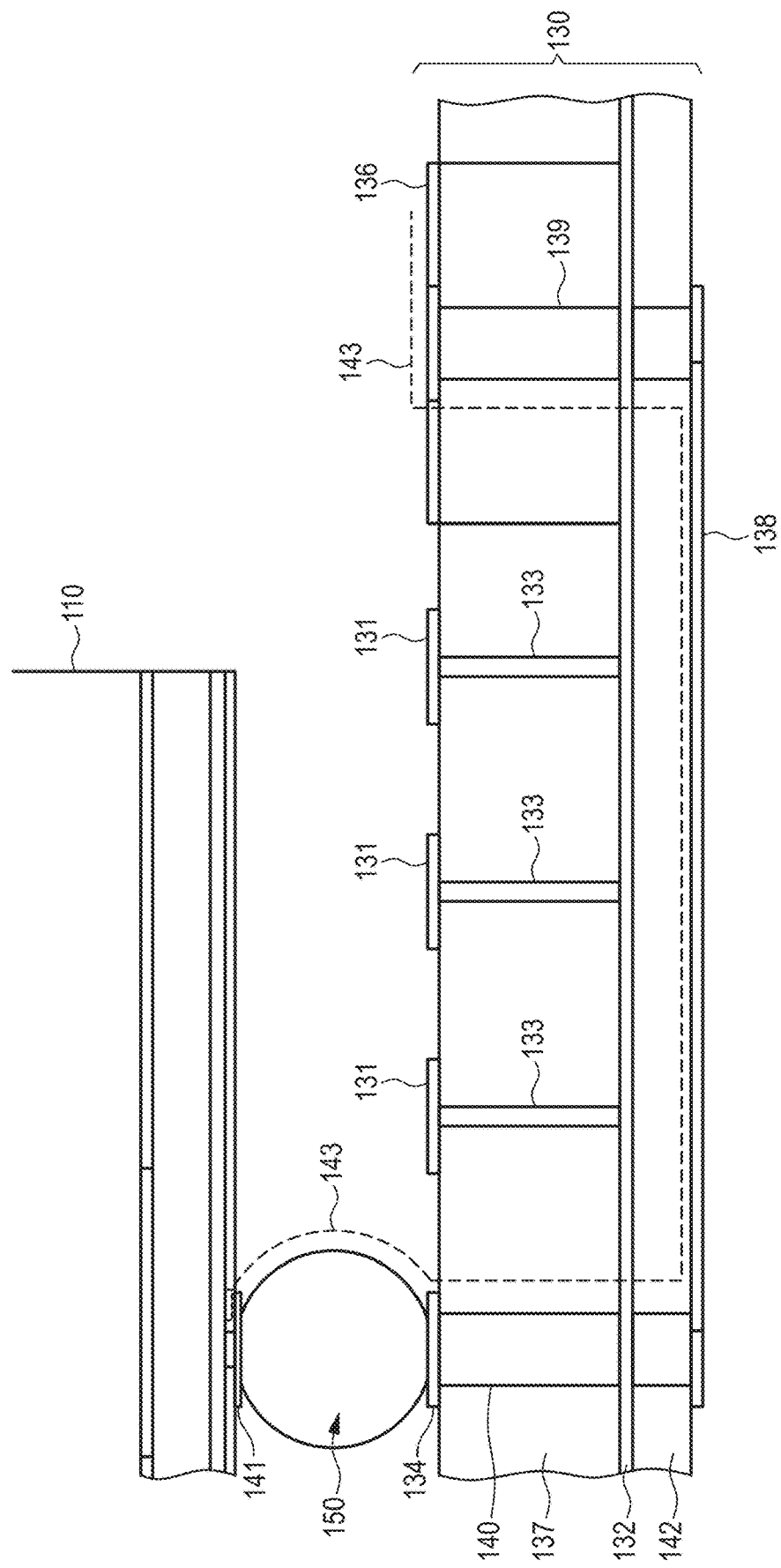

MICROWAVE ANTENNA APPARATUS

CROSS-REFERENCE TO RELATED APPLICATION

The present application claims priority to EP 19165279.1, filed Mar. 26, 2019, the entire contents of which are incorporated herein by reference.

BACKGROUND

Field of the Disclosure

The present disclosure relates to a microwave antenna apparatus.

Description of Related Art

Fan-out wafer level packaging technology such as the embedded wafer-level ball grid array (eWLB) is a mature technology for mm-wave radar and communication systems. This packaging technology is the first choice for low-cost system integration of MMICs, passives, and antennas into a single plastic package.

In academic research many different types of planar antenna structures have been published so far. They all have in common, that the antenna elements are printed on one or more redistribution layers (RDLs). The integration and interconnection between the chip and antenna is performed at RDL level.

The disadvantage of the aforementioned solutions is their narrow bandwidth (1-5%), distorted radiation patterns, and the high amount of parasitic radiation to all directions.

WO 2017/167987 A1 discloses a microwave antenna apparatus comprising a semiconductor element and an antenna element embedded into a mold layer, which is covered by a redistribution layer. The antenna element is preferably configured as SMD component so that it can be handled by a standard pick and place process. The coupling between semiconductor element and antenna element is provided either by a metal layer or aperture coupling within the redistribution layer. The microwave antenna apparatus may be coupled to a PCB arrangement thus forming an eWLB or embedded micro-wafer-level-packaging (emWLP) package. Further, in an embodiment electromagnetic band gap structures (EBGs) structures are used as a reflector and arranged at a distance from the antenna element on the complete surface under the package.

One of the most important challenges for such package antennas is on one hand to couple the RF signal from RDL layer to the antenna on eWLB and on the other hand to reduce the ripples caused by epoxy and reflector placed on a PCB layer conventionally used a carrier.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly nor impliedly admitted as prior art against the present disclosure.

SUMMARY

It is an object to provide a microwave antenna apparatus that couples the RF signal from RDL layer to the antenna on eWLB and that reduces unwanted ripples and surface waves.

According to an aspect there is provided a microwave antenna apparatus comprising
a package module comprising a semiconductor unit, an antenna unit arranged on a first side of the package module and a redistribution layer arranged on a second side of the package module opposite the first side, and
an electromagnetic band gap structure, EBG, module coupled to the redistribution layer of the package module.

One of the aspects of the disclosure is to overcome unwanted ripples in the radiation pattern and surface waves, by providing electromagnetic band gap structures (EBGs) (the EBG module) that may be integrated on a PCB layer used as carrier and couple the EBG module to the RDL layer of the package module, e.g. via solder balls. Signal and power interconnects that are required between the eWLB package and the PCB arrangement may be provided by not filling the complete surface of the PCB with EBGs which enables placement of coupling element like solder balls or pins with current manufacturing technology. The proposed solution thus presents a practical realization of EBGs having the same performance as an ideal EBG realized on an infinite plane.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein:

FIG. 10 shows a transition designed without EBG.

DETAILED DESCRIPTION OF THE EMBODIMENTS

Figure 1:
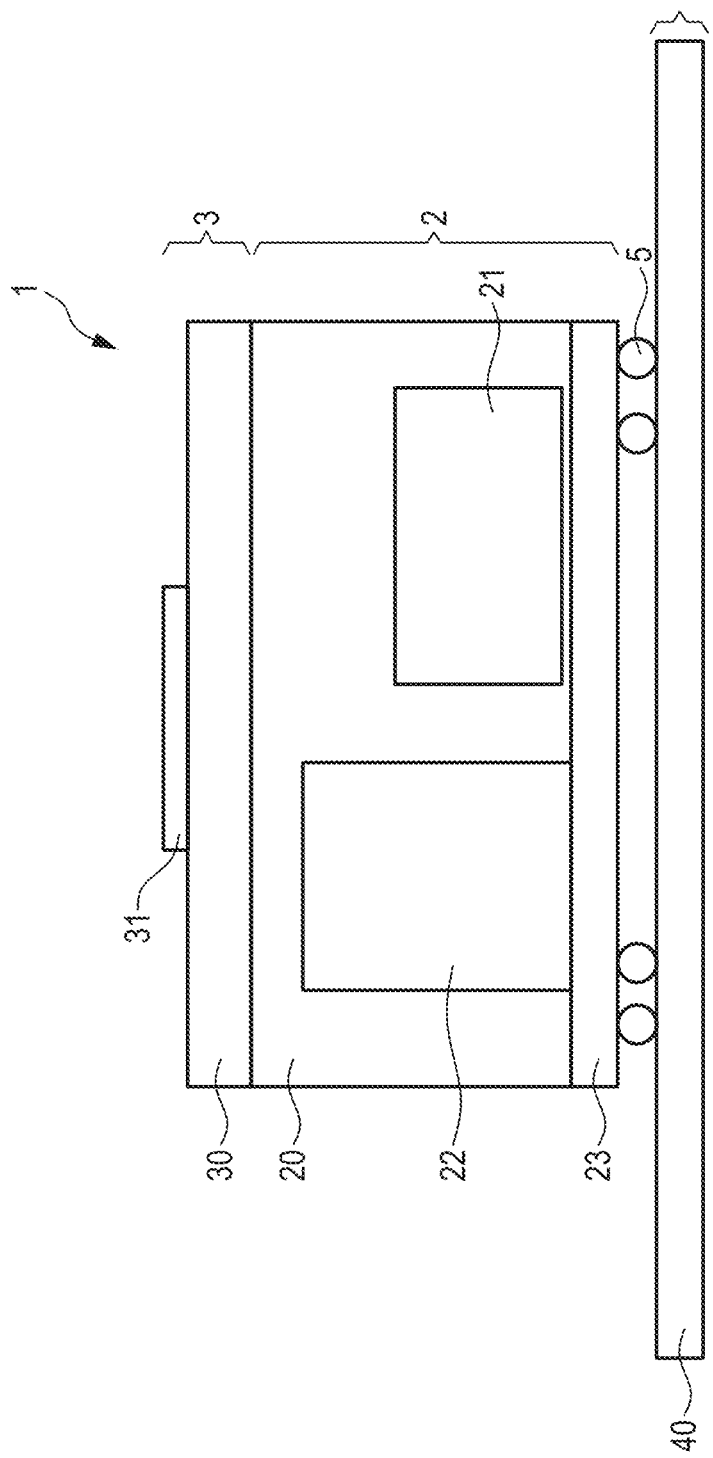
FIG. 1 shows a microwave antenna package making use of a package-on-package antenna concept.

Referring now to the drawings, wherein like reference numerals designate identical or corresponding parts throughout the several views, FIG. 1 shows a microwave antenna package 1 making use of a package-on-package (PoP) antenna concept. The microwave antenna package 1 comprises a semiconductor package module 2, an antenna module 3 mounted on top of the semiconductor package module 2 and a PCB arrangement 4 coupled to the semiconductor package module 2 via solder balls 5 (or pins). The semiconductor package module 2 includes a mold layer 20 (e.g. made of epoxy), a semiconductor element 21, an antenna coupling element 22 and a redistribution layer 23. The antenna module 3 includes an antenna substrate 30 and one or more antenna elements 31 (e.g. a patch antenna). The PCB arrangement 4 includes a PCB layer 40.

This PoP antenna concept opens up the opportunity for the different types of antennas that were not possible because of the eWLB package size limitations, non-desired results caused by epoxy and reflector on the PCB etc. As shown in FIG. 1, the semiconductor element 21 and the antenna coupling element 22 are connected at RDL level. The RF signal is coupled through the antenna coupling element 22 to the antenna 31 with different coupling techniques.

The following antenna types can be integrated with eWLB if the antenna module 3 is realized as a separate module and placed on top of eWLB package (the semiconductor package module 2) using a pick and placer device: Aperture coupled patch with large antenna array, dielectric resonator antenna (DRA) array, dielectric rod antenna array, 3D helical antennas, antenna array with parasitic patches (acts as directors), antenna array with resonant cavity (as superstrate), antenna arrays, waveguide antennas, and substrate integrated waveguide (SIW) slot antennas/arrays.

This PoP antenna concept integrated with eWLB technology allows reducing beam widths or forming a beam with different desired beamwidths by using large antenna arrays. The ground plane can be placed at the interface of epoxy or at any layer of the antenna coupling element 22 or in the PoP antenna module 3 to isolate the antenna from epoxy. Here, the challenge is to couple the signal to the PoP antenna module 3 from the RDL layer 23.

The present disclosure proposes a set of solutions to couple the signal to the antenna that is placed on top of eWLB package using one or more of through package via (TPV) combined with aperture coupling, micro-coaxial (with the help of vias), back to back aperture coupling, waveguide (fed by an antenna), and TPV plus solder balls.

PoP antennas help to resolve many issues. But since this antenna was to be mounted on PCB boards, for some applications where one beam is wide enough or even both wide beams are required (in particular, wide halfpower beam width in horizontal or vertical direction or in both directions is required), a reflector or ground plane in the PCB arrangement 4 creates some problems and add some ripples. This is addressed by the present disclosure.

Figure 2:
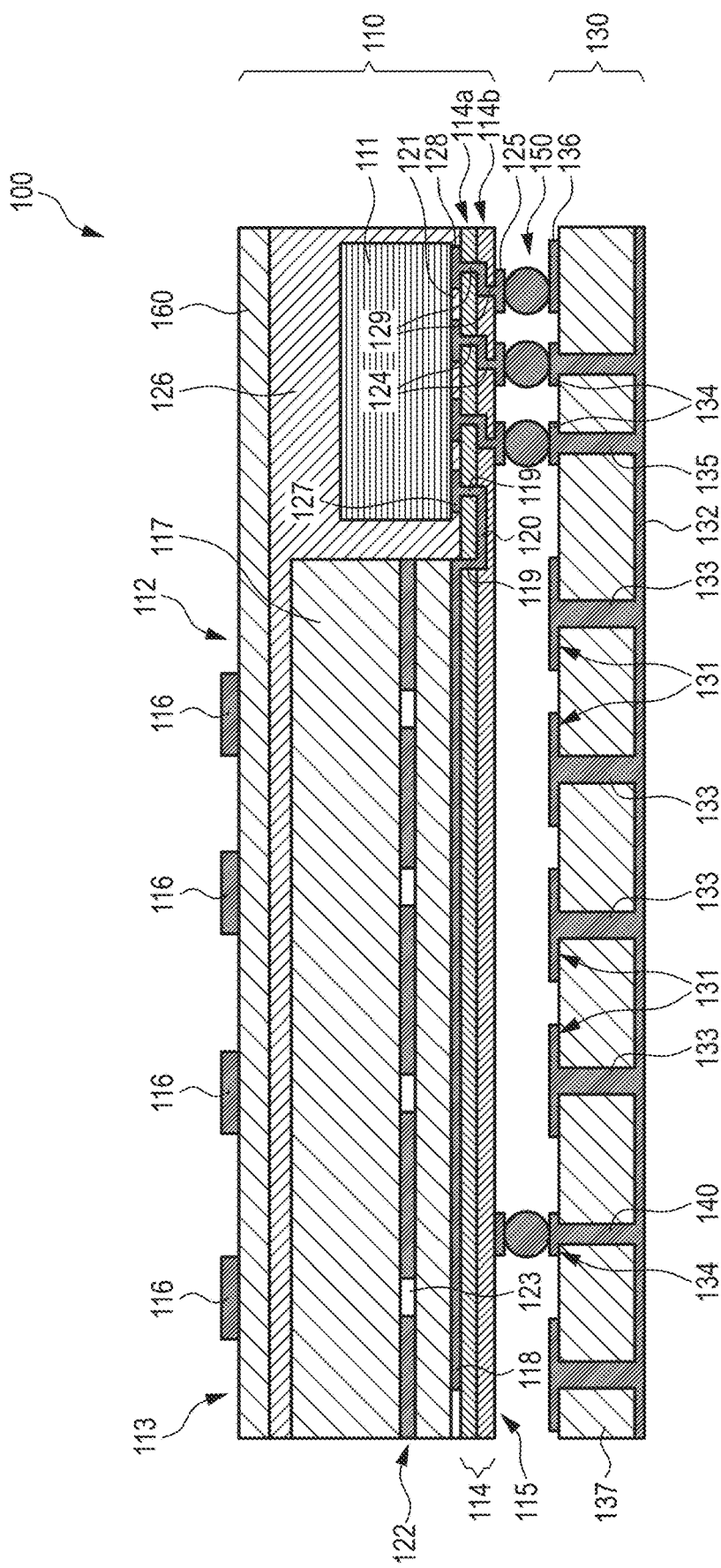
FIG. 2 shows a first embodiment of a microwave antenna apparatus according to the present disclosure.

The present disclosure presents a solution for this problem by adding an electromagnetic band gap (EBG) structure below the package module as illustrated in FIG. 2 showing a first embodiment of a microwave antenna apparatus 100 according to the present disclosure. The microwave antenna apparatus 100 generally comprises a package module 110 and an EBG module 130 coupled to the package module 110, in particular to a redistribution layer of the package module 110, via solder balls 150.

The package module 110 generally comprises a semiconductor unit 111 (also called chip), an antenna unit 112 arranged on a first side 113 of the package module 110 and a redistribution layer (RDL) unit 114 (in this embodiment comprising two redistribution layers 114a, 114b; in other embodiments comprising a redistribution layer) arranged on a second side 115 of the package module 110 opposite the first side 113. The semiconductor unit 111 is embedded in a mold layer 126. The antenna elements 116 are provided on top of an antenna substrate layer 160, but may alternatively be provided within the antenna substrate layer 160.

In this embodiment the RF signal is coupled from the chip 111 to the antenna elements 116 of the antenna unit 112 via microstrips through a coupling element 117 (also called coupling block). A microstrip line 118 arranged between the RDL layer 114a and the antenna coupling unit 117 is coupled to the semiconductor unit 111 through vias 119, another microstrip line 120 and a chip signal contact 127. Within the antenna coupling unit 117 a ground layer 122 with opening 123 is arranged for coupling the RF signal from the microstrip line 118 to the antenna elements 116. The chip ground 121 is coupled to the EBG module 130, in particular to solder ball patches 134, through vias 124 and an under bump metallization (UBM) layer 125.

An EBG structure, as used here as EBG module 130, generally is a metallo-dielectric structure formed by a fine, periodic pattern of small metal patches 131 that are in this (mushroom type) embodiment connected to an EBG ground plane 132 (serving as reflector) through EBG vias 133, which prevents/assists the propagation of electromagnetic waves in a specific band of frequency called band-gap. This EBG structure 130 helps absorbing unnecessary radiation on the back side of the antenna that destructively interferes with radiated waves.

The EBG structure 130 thus comprises a plurality of EBG cells, each comprising a patch 131 and an EBG via 133, and signal interconnects, each comprising a solder ball patch 134 and a via 135. The EBG vias 133, the (conventional) vias 135 and a signal via 140 are leading through a substrate 137 and are connected to the EBG ground plane 132. The solder ball patches 134 are connected to the UBM layer 125 via solder balls 150. Via an external microstrip line 136 an external signal can be provided to the semiconductor unit 111 from an intermediate frequency (IF) line (not shown) through a solder ball 150 and vias 129 to a chip contact 128.

In this embodiment the feed lines are connected by conventional vias (135, 140) with landpads. Due to their shape they look similar like a mushroom EBG cell but they are interrupting the EBG surface. According to the present disclosure a solution has been found to interrupt the EBG surface for interconnect signals and restrict the area of the EBG, although generally a signal interconnect disturbs and interrupts the EBG surface.

In particular, according to the present disclosure some EBG cells are removed in the EBG module 130. The removal may be arranged in a separate way. For instance, EBG cells may be placed on a first PCB layer and may be connected to a ground plane on a second PCB layer, which has at least the size of the overall EBG area. RF, power and digital signal lines are placed on (further) lower PCB layers (e.g. a third, fourth, fifth, . . . PCB layer). Conventional signal vias are used to interconnect the package module and the signal lines. Therefore, the EBG structure is interrupted and cutout holes around the signal vias are placed in the ground plane.

To design such modules low cost high density interconnect PCBs or package modules with microvia capability on more than three layers may be used. High density interconnect PCBs were generally only applicable to digital designs in the past. Enhancing this process for mm-wave applications are now available from advanced PCB manufacturers.

Other types of EBG structures than the one shown in FIG. 2 may alternatively be used in other embodiments of an microwave antenna apparatus, such as a (planar type) embodiment in which the metal patches 131 are not connected to the EBG ground plane 132. The substrate 137 may be made of FR4, glass, epoxy, polyimide, PTFE, or hydrocarbon.

Figure 3A:
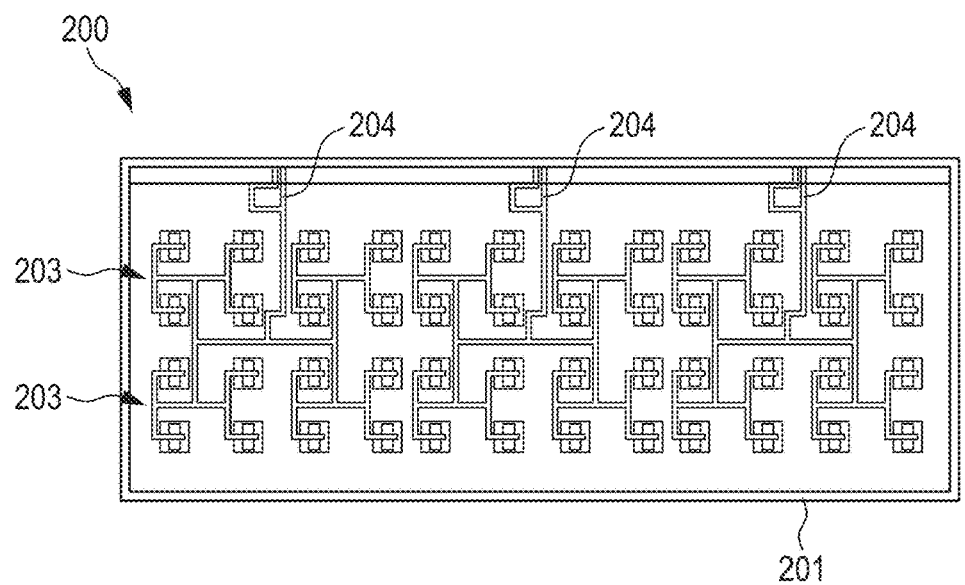
FIGS. 3A, 3B and 3C show a conventional microwave antenna apparatus.
Figure 3B:
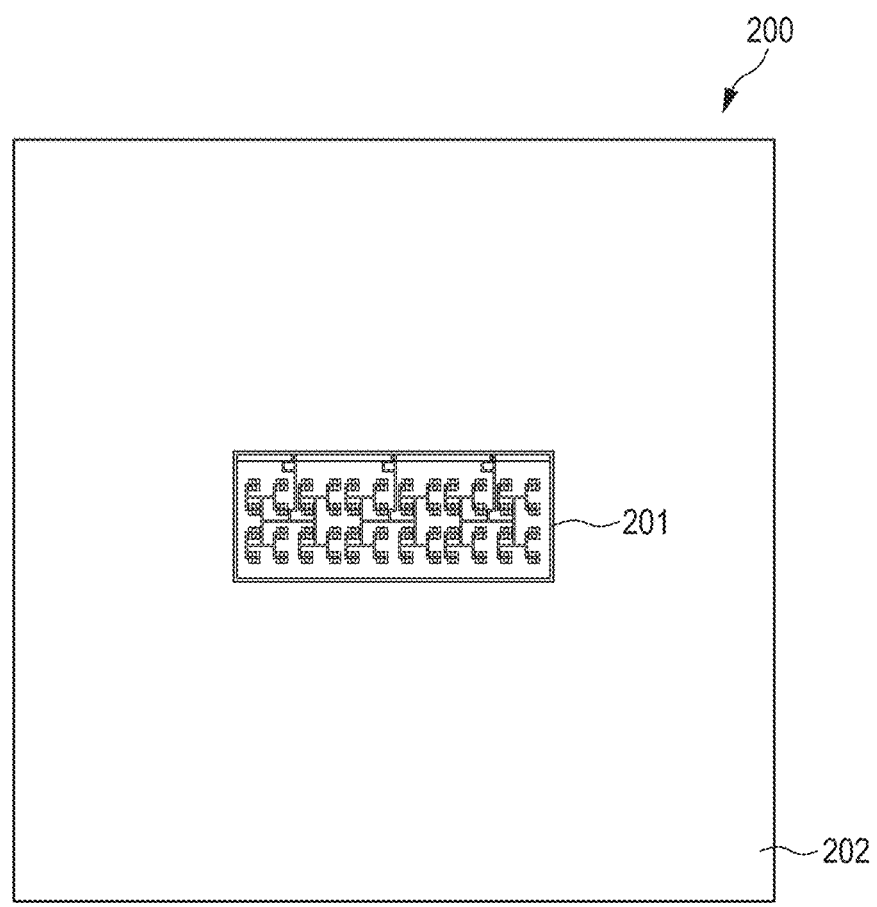
Figure 3C:
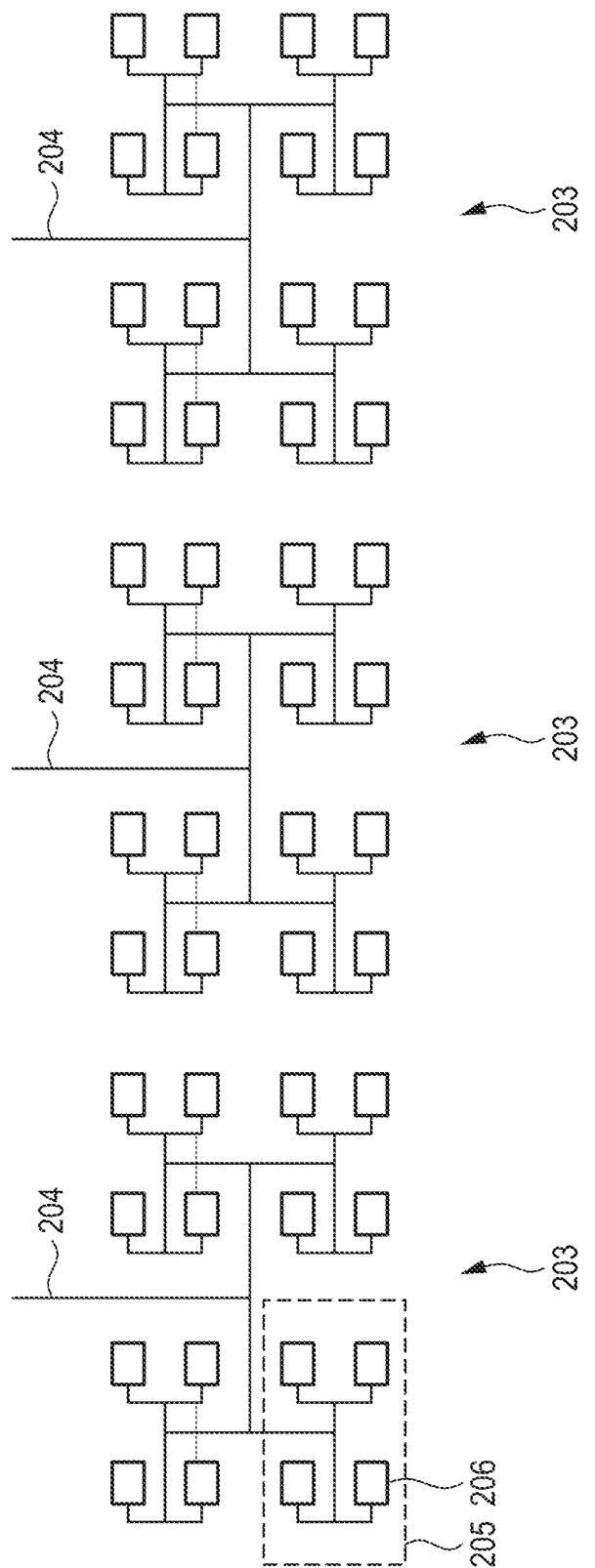
Figure 4:
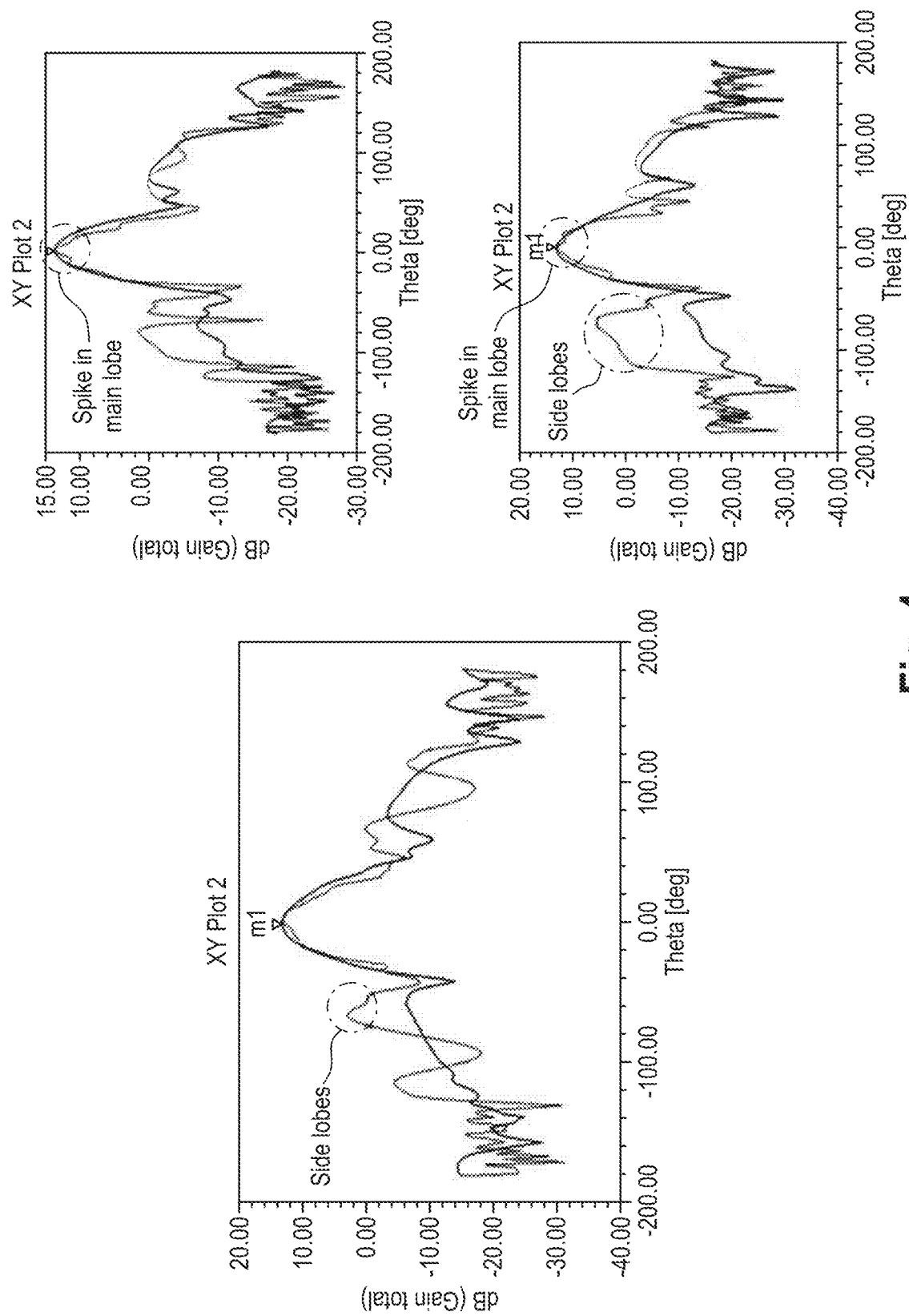
FIG. 4 shows a diagram illustrating a radiation pattern resulting from the microwave antenna apparatus shown in FIG. 3.

FIG. 3 shows a conventional microwave antenna apparatus 200 including an antenna unit 201 with reflector 202 below. FIG. 3A shows the antenna unit 201 (comprising a number of antenna arrays 203) without the surrounding metal ground layer; FIG. 3B shows the antenna unit 201 including the surrounding metal ground layer 202; FIG. 3C shows an enlarged view of three antenna arrays 203 which are fed individually by three feedlines 204. The ports of the feedlines 204 are arranged at the upper side of the antenna unit 201 shown in FIG. 3A. Each antenna array 203 (also called 4×4 array) consists of four sub arrays 205 each comprising four patch antenna elements 206. The microwave antenna apparatus 200 achieves high side lobes and slight distortions in the radiation pattern (from three antenna arrays) as illustrated in FIG. 4. Because of the 4×4 array used in the microwave antenna apparatus 200 shown in FIG. 3, some of the ripples effects have been taken care of as the 4×4 array results in a narrower beam, but still some of the effects are not taken care of.

Figure 5A:
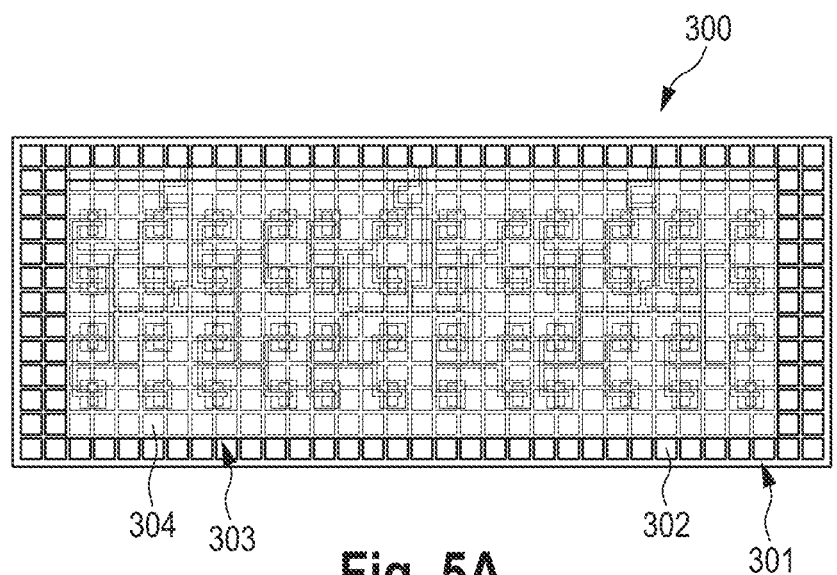
FIGS. 5A and 5B show a microwave antenna apparatus according to the present disclosure.
Figure 5B:
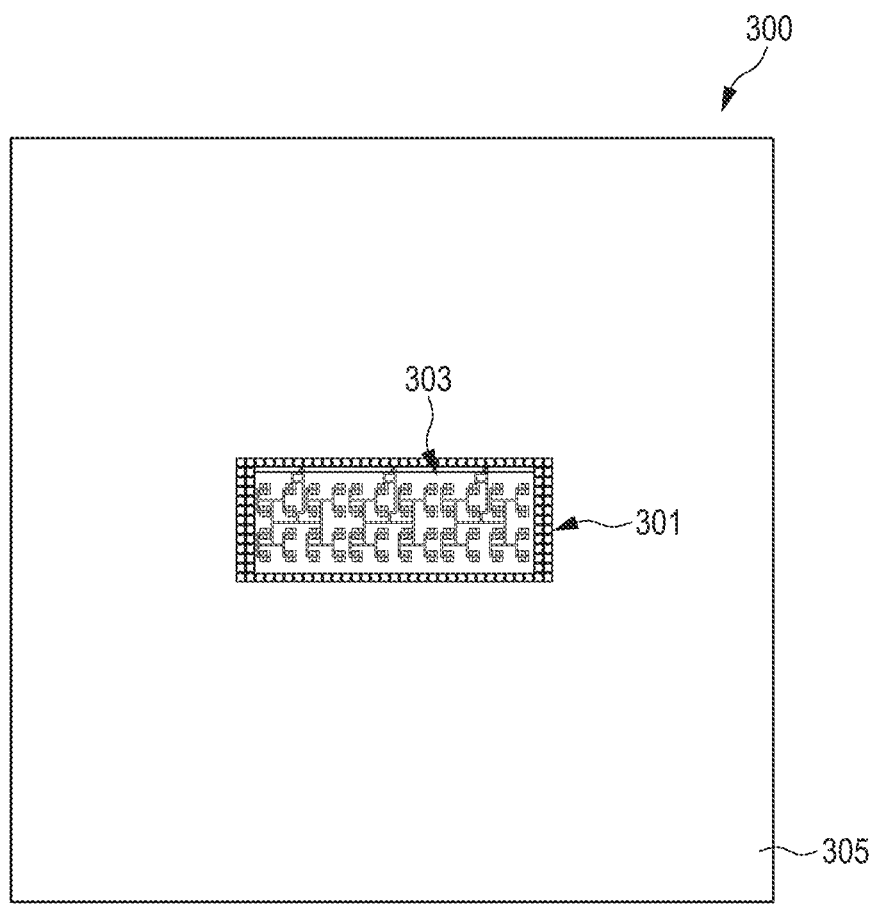
Figure 6A:
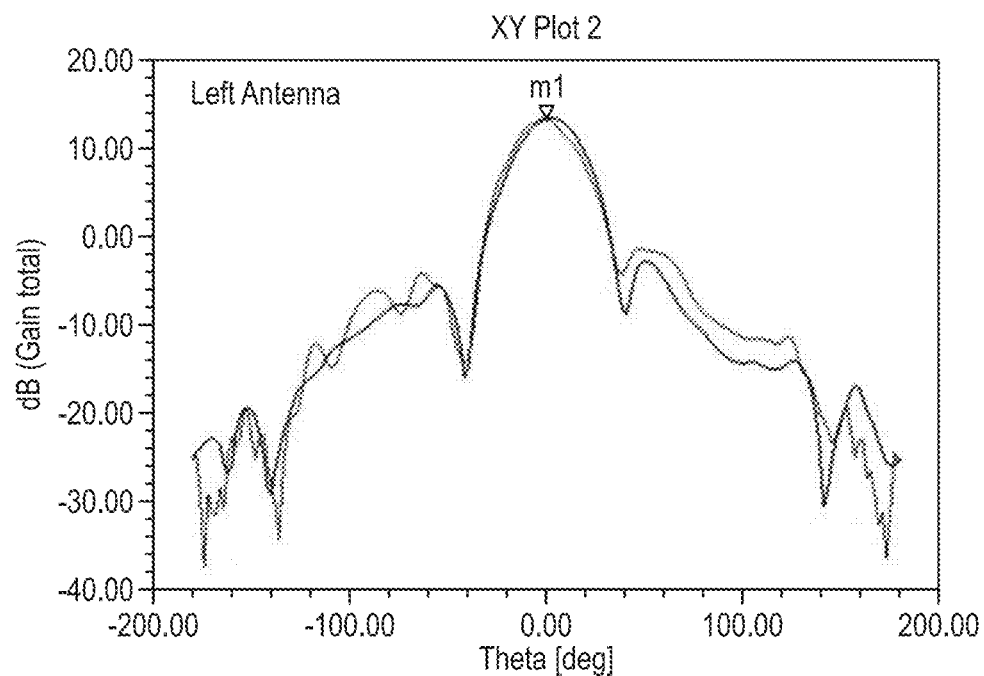
FIGS. 6A and 6B show a diagram illustrating a radiation pattern resulting from the microwave antenna apparatus shown in FIG. 5.
Figure 6B:
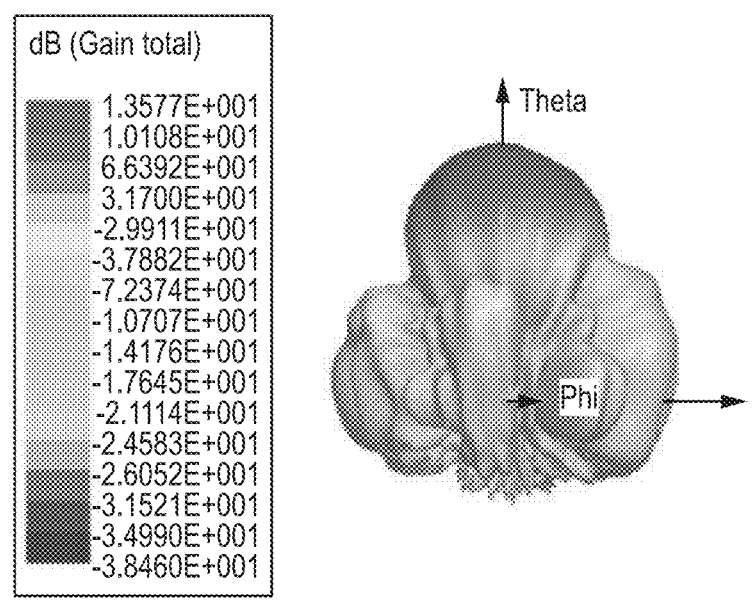

FIG. 5 shows an embodiment of a microwave antenna apparatus 300 according to the present disclosure with a ground reflector and an EBG structure of a plurality of EBG cells 302 on the substrate below the antenna array 303. FIG. 5A shows the EBG structure 301 and the antenna array 303 of a plurality of antenna elements 304 without the surrounding metal ground layer; FIG. 5B shows the EBG structure 301 and the antenna array 303 including the surrounding metal ground layer 305 serving as the ground reflector. FIG. 6 shows the radiation patterns of the three 4×4 antenna array of the microwave antenna apparatus 300 shown in FIG. 5 (FIG. 6A shows the plots of the radiation; FIG. 6B shows the 3D-pattern). Side lobes are suppressed and the distortion in radiation pattern is taken care of. This manifests that by using an EBG structure the performance of a microwave antenna apparatus, in particular in an eWLB package, can be improved.

Figure 7:
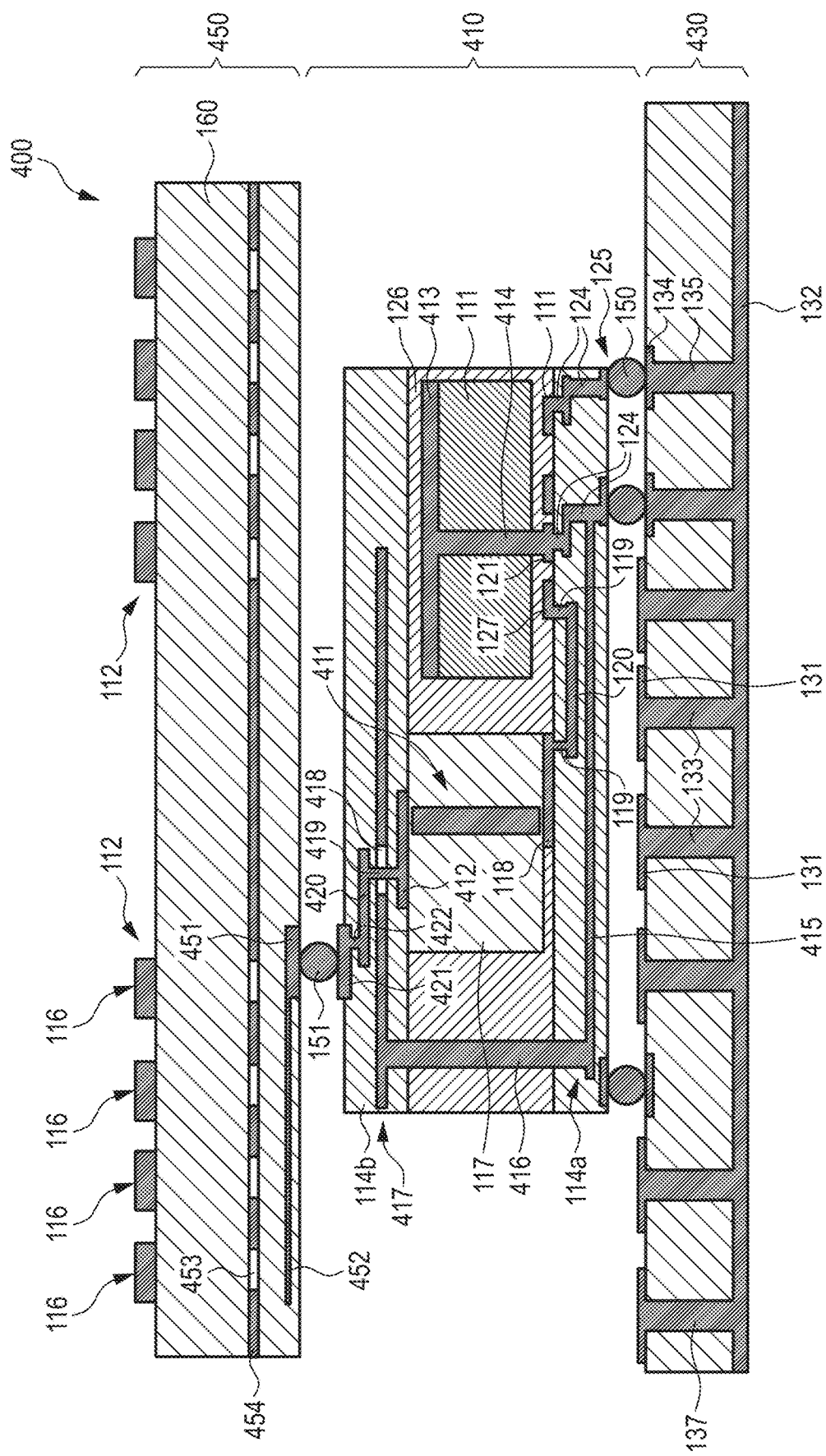
FIG. 7 shows a second embodiment of a microwave antenna apparatus according to the present disclosure.

FIG. 7 shows a second embodiment of a microwave antenna apparatus 400 according to the present disclosure. As far as possible the same reference numeral are used as in FIG. 2 to reference the same elements.

The microwave antenna apparatus 400 comprises a semiconductor package module 410, an EBG module 430 coupled to the semiconductor package module 410 via solder balls 150 and a PoP antenna module 450 coupled to the semiconductor package module 410 via solder balls 151. A first RDL layer group 114a (comprising one or more polymer layer or RDL layers) is arranged on the bottom side of the semiconductor package module 410 and a second RDL layer group 114b is arranged on the top side of the semiconductor package module 410. Thus, in this embodiment separate RDL layer groups 114a, 114b are arranged on two sides of the semiconductor package module 410.

In this embodiment the RF signal is coupled from the chip 111 to the antenna elements 116 via the microstrip through the coupling element 117 as well. In particular, the RF signals is coupled from the chip 111 through the chip contact 127, vias 119, microstrip lines 118, 120 and a through via 411 through the coupling element 117 to a metal layer 412 on top of the coupling element 117.

A chip ground layer 413 is provided on top of the semiconductor element 111 (generally as part of the semiconductor element 111), which is connected with the ground layer 121 on the bottom of the semiconductor element 111 by a semiconductor via 414. Further, the microstrip line 120 (in the RDL layer group 114a) picking up the RF signals has a separate ground plane 415 in the RDL layer group 114a. The ground interconnections, in particular vias 124 and 416 through the mold layer 126 and the RDL layer group 114a, respectively, are also shown in FIG. 7.

In the upper RDL layer group 114b a ground layer 417 is provided having a slot 418, through which a via 419 leads to microstrip 420, which is connected to the metal layer 412 and a coupling line 421 by a via 422. The coupling line 421 is preferably connected to a coupling line 451 of the antenna module 450 by the solder ball 151 (or in any other suitable way).

In the antenna module 450 the antenna feed layer 452 is connected to coupling line 451. The antenna feed layer 452 couples the RF signal to the antenna elements 116 through openings 453 in an antenna ground layer 454 provided in the antenna substrate layer 160.

In this embodiment the antenna module 450 extends beyond the semiconductor package 410. The antenna module 450 can be placed on semiconductor package 410 using a pick and place machine, e.g. using some fiducial marks. Conductive epoxy (not shown) may be provided for ground connections. The conductive epoxy provides a reliable connection between coupling lines.

Figure 8A:
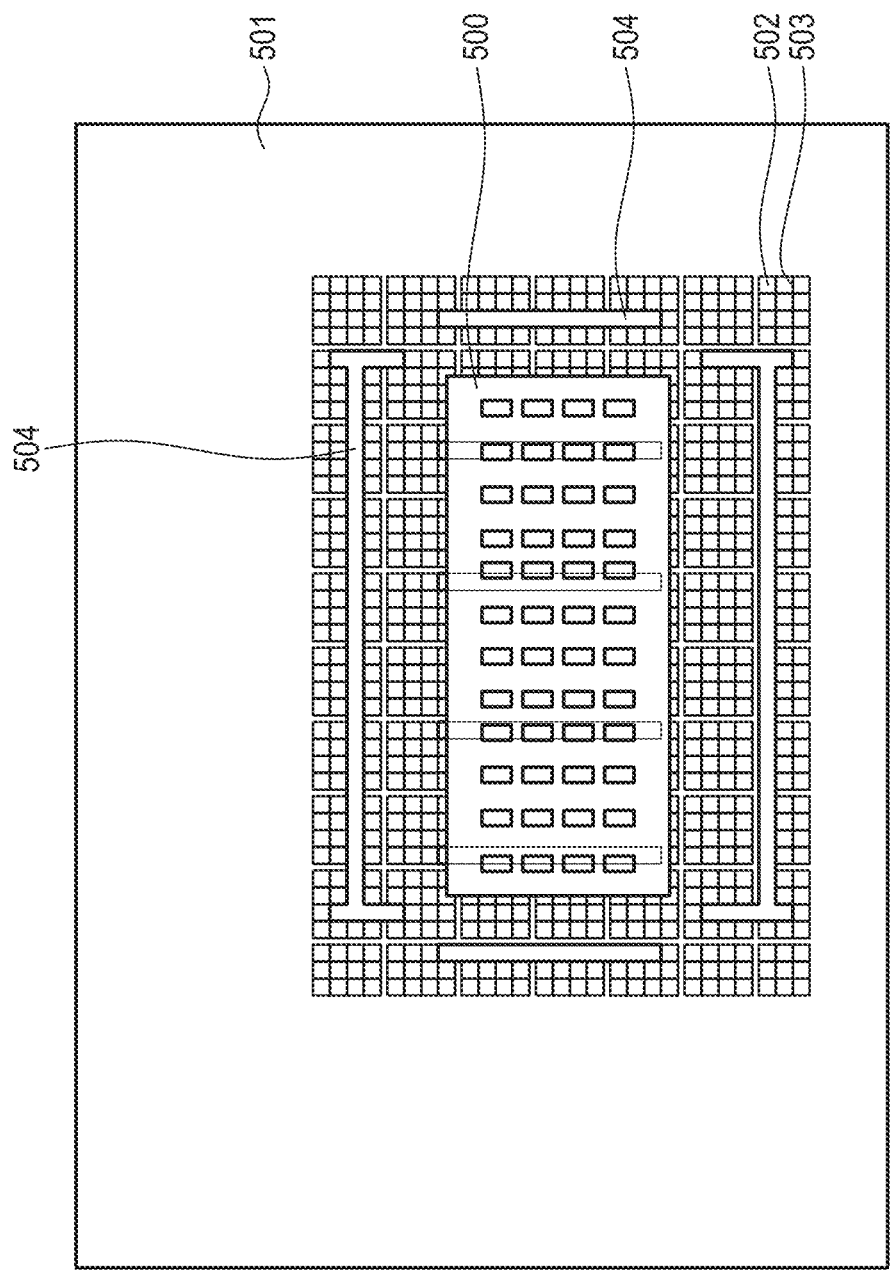
FIGS. 8A and 8B show diagrams illustrating the removal of EBG cells for the landing of IF and DC lines.
Figure 8B:
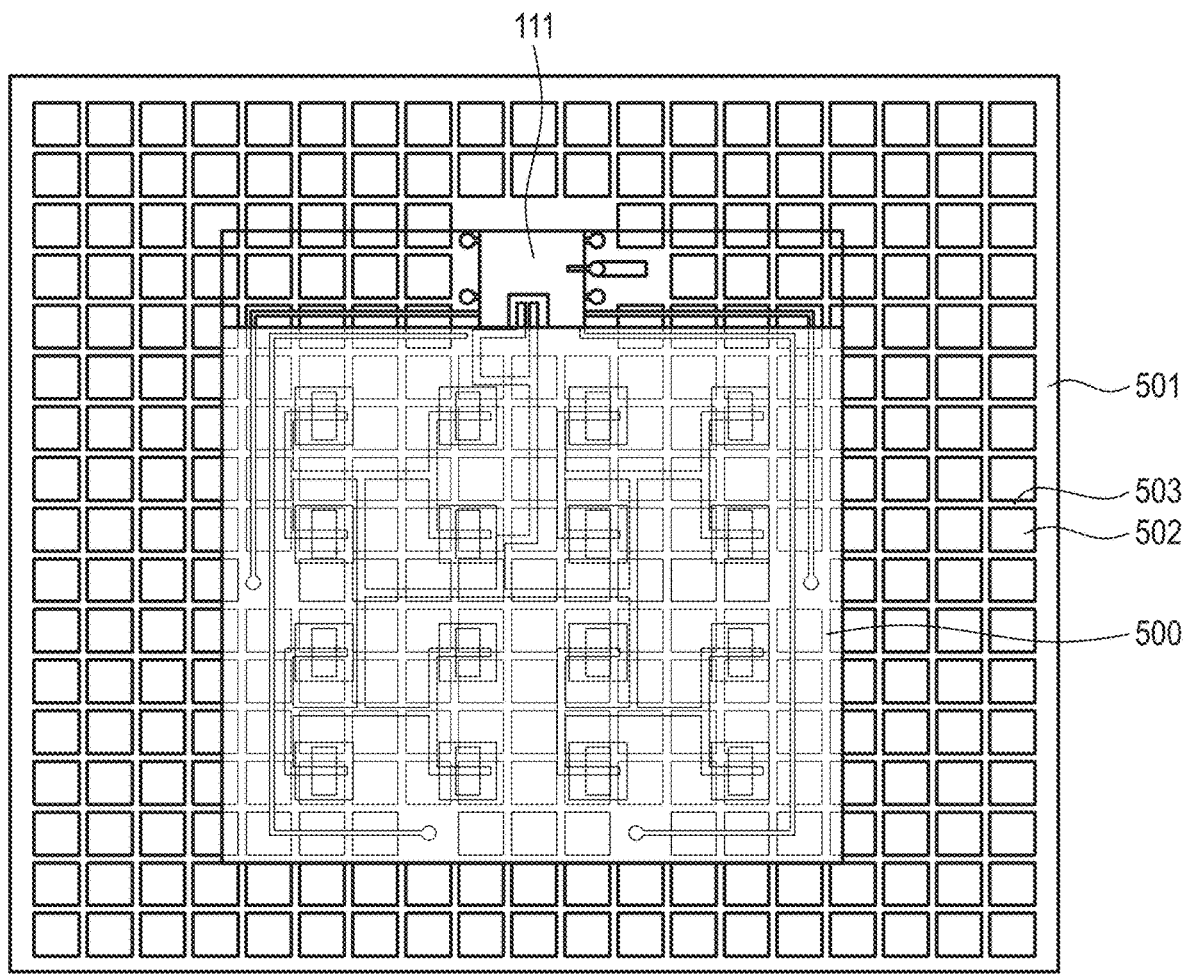

IF and DC signals are connected from the EBG module 430 to the semiconductor package module 410 via solder balls. To have enough space for solder ball interconnects some of the EBG cells must be removed. FIG. 8 shows diagrams illustrating the removal of EBG cells for the landing of IF and DC lines. FIG. 8A shows an antenna array 500 with a surrounding EBG ground layer 501. Further, the EBG patches 502 and the EBG substrate material 503 between the EBG patches 502 is shown. In some areas 504 the EBG patches 502 are removed for solder ball and interconnect placement. These areas 504 are preferably arranged symmetrically with respect to the antenna array 500. FIG. 8B shows an enlarged view including the semiconductor element 111. RF, IF, digital, and DC signals are coupled (transferred) from the EBG module to the redistribution layers of the package, but the EBG cells do not have a physical connection to the redistribution layers of the package.

Figure 9A:
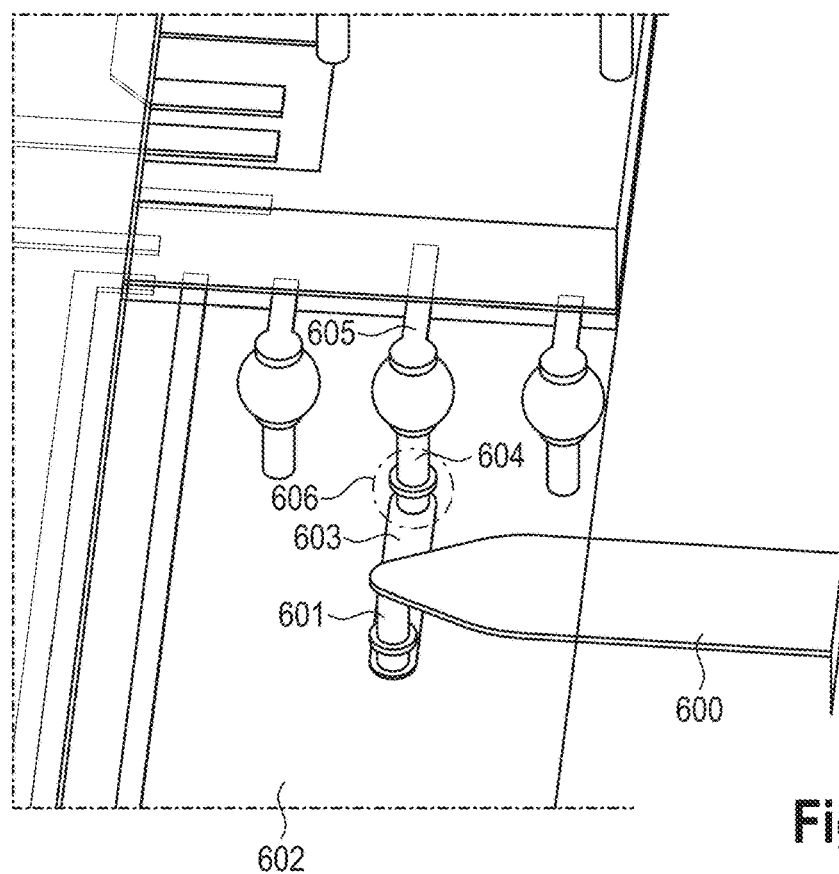
FIGS. 9A and 9B show an IF transmission line and different microstrip-microstrip transitions in a top view (FIG. 9A) and a tilted view (FIG. 9B).
Figure 9B:
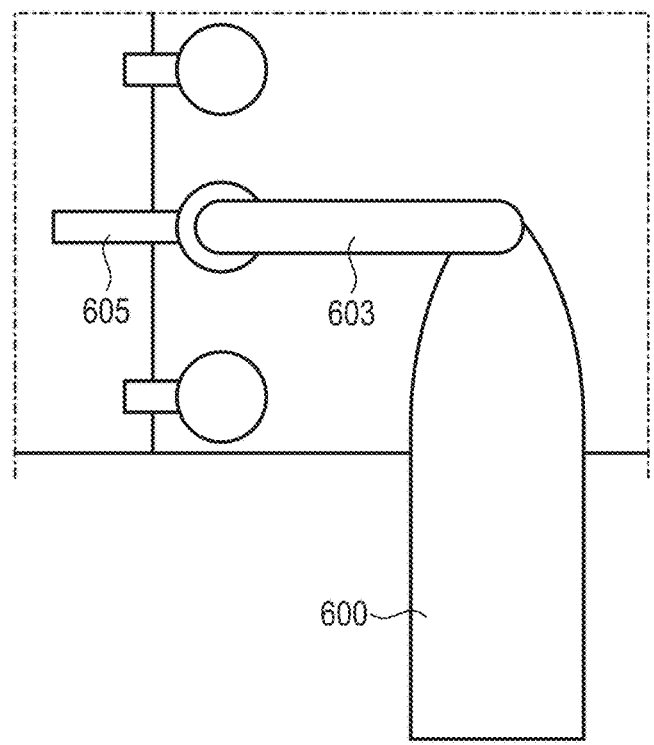

FIG. 9 shows an IF transmission line and different microstrip-microstrip transitions in a top view (FIG. 9A) and a tilted view (FIG. 9B). It shows a microstrip line 600 connected by a via 601 through a ground plane 602 to another microstrip line 603, which is connected through a ground cut 606 in the ground plane 602 by another via 604 to a contact element 605.

FIG. 10 shows a transition for transferring the signal from an embedded chip through microstrip to microstrip transition. It shows a three EBG cells each comprising an EBG patch 131 and an EBG via 133 contacting the EBG ground layer 132 serving as reflector. The EBG ground layer 132 is arranged between a first PCB layer 137 and a second PCB layer. An external signal provided at the external microstrip line 136 is coupled to the contact 141 of the package module 110 along the signal path 143 (or of the semiconductor package module 410) through the via 139, the IF line 138, a signal via 140, the solder ball contact 134 and the solder ball 150.

Figure 11:
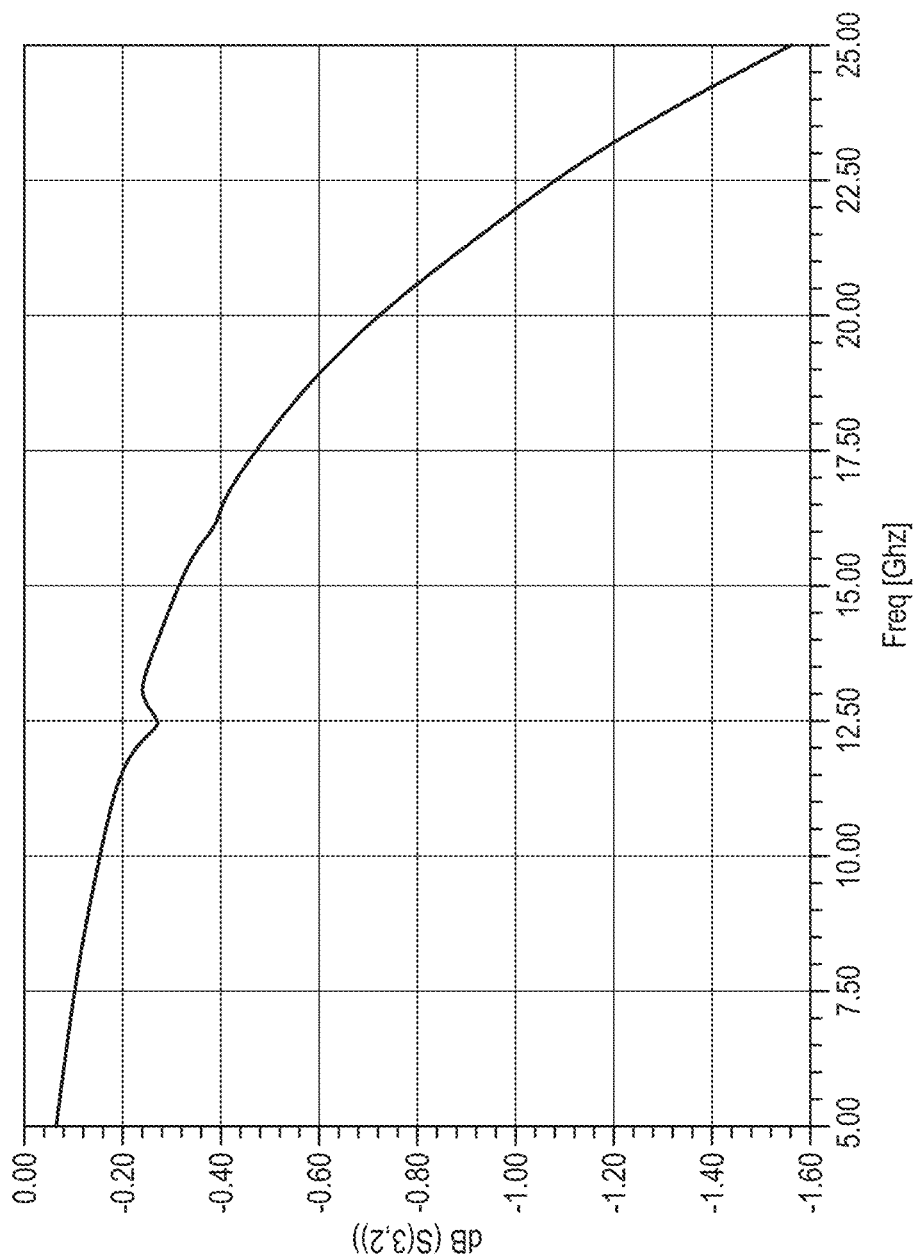
FIG. 11 shows a diagram illustrating the insertion Loss response for IF transmission line transitions.

FIG. 11 shows a diagram illustrating the insertion loss response for IF transmission line transitions.

Figure 12:
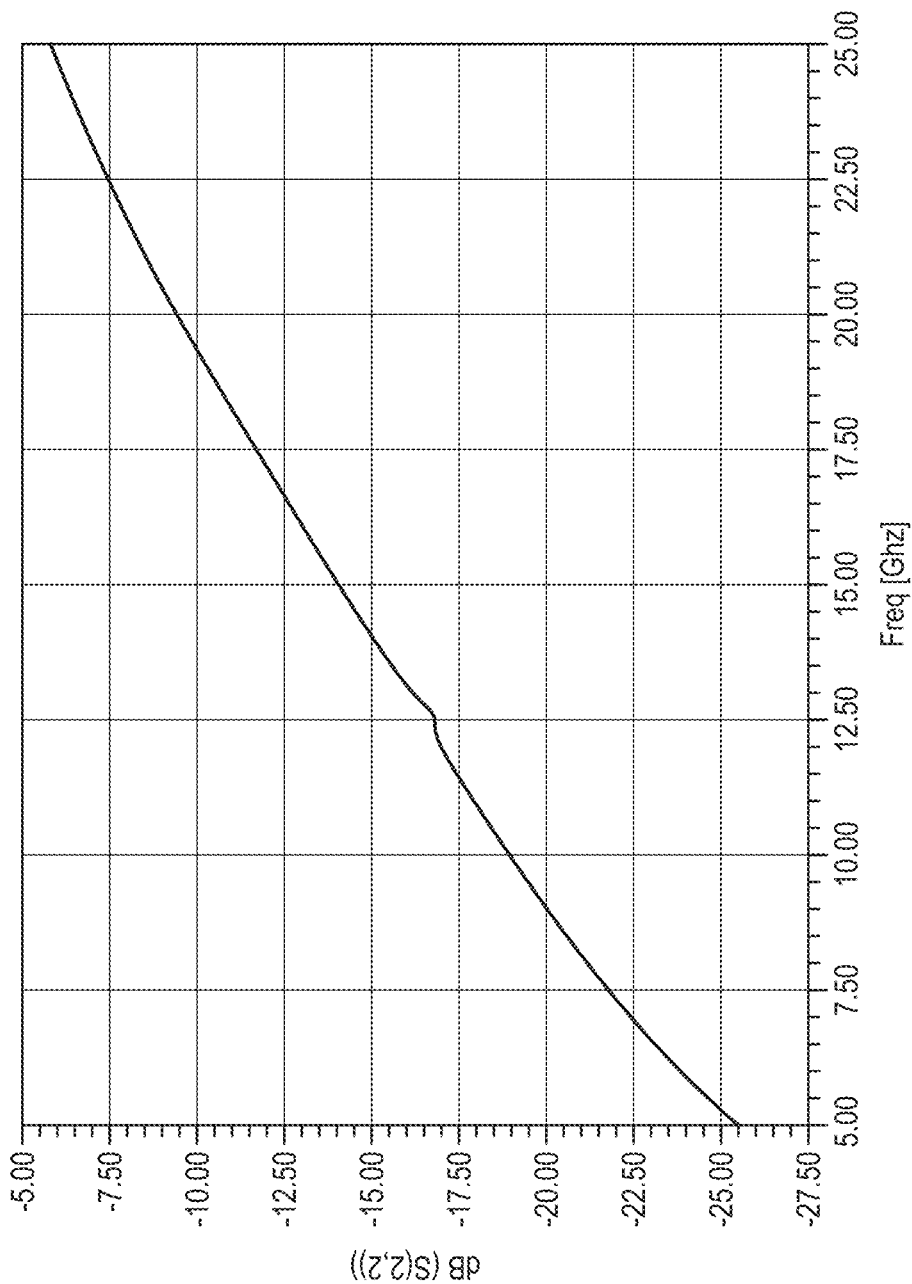
FIG. 12 shows a diagram illustrating the return loss response for transition at IF.

FIG. 12 shows a diagram illustrating the return loss response for transition at IF.

Hence, as shown above, an EBG structure below the antenna for large reflector structures removes ripples and decreases the side lobe level. The band-gap feature of EBG structures is useful in suppressing the surface waves. The surface waves reduce the antenna efficiency and gain, the EM waves propagate along the ground plane instead of radiating into free space. The diffraction of surface waves increase the back lobe radiation, which may deteriorate the signal to noise ratio, and raise the mutual coupling levels in array designs, resulting in blind scanning angles in phased array systems for example.

Antenna and feeding mechanisms can be of different types: patch antenna with inset fed and patch antenna with aperture coupling, series fed patch antennas, dipole antennas, SIWs. There can be microstrip lines on the EBG layer and there can be one or more RDL layers.

The disclosed EBG structure can be used for simple eWLB package and Package-on-Package emWLB structures. The substrate of the EBG structure may any substrate, such as FR4 based substrate, Rogers, organic, or ceramic, flexible, resin based substrate, etc. Different sizes of the EBG structure may be provided as different sizes are required to improve performance depending upon which type of antenna is being used and how large the antenna array is.

Different types of EBG unit cells may be used: mushroom type EBG cells, uni-planar EBG cells, polarization dependent EBG cells, compact spiral EBG cells, stacked EBG cells, miniaturized EBG cells, or interdigital capacitor EBG cells.

The main advantages of the disclosed solution include:
Suppression of the surface waves, antenna gain enhancement, back lobe reduction thanks to the EBG structure.
With the proposed transitions PoP antennas can be designed, beam width and gain can be better controlled, which will allow avoiding the deteriorating effects of floating ground plane.
Different types of PoP antennas can be fed from the chip.
Performance deteriorating effect of epoxy can be mitigated to some extent to already existing techniques.
PoP antennas along with its proposed transitions provide increased flexibility of designing antennas by completely avoiding the restriction of chip-to-SMT-component area ratio.
A wide variety of interconnects, suitable for different applications, can be integrated with emWLB package in a very compact form enabling the miniaturized 3D RF packaging concept.
A number of coupling techniques have been proposed which will be the enabler to fabricate PoP antennas to enhance the performance and achieve the objective of designing antennas with desired beam width (with some limitations) for future 60 GHz and beyond radar sensors.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

It follows a list of further embodiments of the disclosed subject matter:

1. Microwave antenna apparatus comprising:
 a package module comprising a semiconductor unit, an antenna unit arranged on a first side of the package module and a redistribution layer group arranged on a second side of the package module opposite the first side, and
 an electromagnetic band gap structure, EBG, module coupled to the redistribution layer group of the package module.

2. Microwave antenna apparatus as defined in any preceding embodiment,
 wherein the EBG module comprises one or more EBG cells.

3. Microwave antenna apparatus as defined in any preceding embodiment,
 wherein the antenna unit comprises one or more antenna elements arranged in an antenna area on the first side of the package module and
 wherein the one or more EBG cells are arranged in an EBG area on first surface of the EBG module facing the package module, said EBG area being arranged opposite the antenna area.

4. Microwave antenna apparatus as defined in embodiment 3,
 wherein the EBG area has at least the same size as the antenna area.

5. Microwave antenna apparatus as defined in embodiment 3 or 3,
 wherein the EBG module comprises a ground layer arranged on the first surface of the EBG module around the EBG area.

6. Microwave antenna apparatus as defined in any one of embodiments 2 to 5,
 wherein the one or more EBG cells are mushroom type EBG cells, uni-planar type EBG cells, polarization dependent EBG cells, compact spiral EBG cells, stacked EBG cells, miniaturized EBG cells, or interdigital capacitor EBG cells.

7. Microwave antenna apparatus as defined in any preceding embodiment,
 wherein the EBG module comprises an EBG substrate layer, one or more EBG patches arranged on a first surface of the EBG substrate layer facing the package module, and one or more solder ball pads arranged on the first surface of the EBG substrate layer and contacting the solder balls.

8. Microwave antenna apparatus as defined in embodiment 7,
 wherein the EBG module comprises an EBG ground layer arranged on a second surface of the EBG substrate layer opposite the first surface of the EBG substrate layer and EBG vias connecting the EBG patches with the EBG ground layer and connecting the solder ball pads with the EBG ground layer.

9. Microwave antenna apparatus as defined in embodiment 7 or 8, wherein the EBG module comprises a feed line arranged on the first surface of the EBG substrate layer, a connection line on an inner layer of the EBG module, and vias connecting the feed line with the connection line and connecting the connection line with the one or more solder ball pads.

10. Microwave antenna apparatus as defined in embodiment 7, 8 or 9,
wherein the EBG module further comprises a metal plane arranged within the EBG substrate layer and EBG vias connecting the one or more EBG patches with the metal plane.

11. Microwave antenna apparatus as defined in any preceding embodiment,
wherein the package module comprises
a semiconductor package module comprising the semiconductor unit and the redistribution layer group, the semiconductor unit including a mold layer, a semiconductor element and a coupling element, and
an antenna module, representing the antenna unit, mounted on top of the semiconductor package module and comprising an antenna substrate, one or more antenna elements, an antenna feed layer and an antenna ground layer.

12. Microwave antenna apparatus as defined in any preceding embodiment,
wherein the package module comprises
a mold layer,
a semiconductor element representing the semiconductor unit arranged within the mold layer,
a coupling element arranged within the mold layer,
one or more antenna elements representing the antenna unit arranged on first surface of the mold layer facing away from the EBG layer, and
the redistribution layer group arranged on second surface of the mold layer opposite the first surface.

13. Microwave antenna apparatus as defined in any one of embodiments 2 to 12,
wherein in predetermined areas of the EBG module no EBG cells are arranged.

14. Microwave antenna apparatus as defined in embodiment 13,
wherein said predetermined areas of the EBG module are arranged symmetrically with respect to the antenna unit.

15. Microwave antenna apparatus as defined in embodiment 13 or 14,
wherein in said predetermined areas DC lines and IF transitions are arranged.

16. Microwave antenna apparatus as defined in any preceding embodiment,
wherein the EBG module is coupled to the redistribution layer group of the package module via solder balls or pins.

17. Microwave antenna apparatus as defined in any preceding embodiment,
wherein the redistribution layer group comprises one or more redistribution layers.

The invention claimed is:
1. Microwave antenna apparatus comprising:
a package module comprising a chip, an antenna arranged on a first side of the package module and a redistribution layer arranged on a second side of the package module opposite the first side, and
an electromagnetic band gap structure, EBG, module spaced from and opposite the second side of the package module and coupled to the redistribution layer of the package module.

2. Microwave antenna apparatus as claimed in claim 1,
wherein the EBG module comprises one or more EBG cells.

3. Microwave antenna apparatus as claimed in claim 1,
wherein the antenna comprises one or more antenna elements arranged in an antenna area on the first side of the package module and
wherein the one or more EBG cells are arranged in an EBG area on a first surface of the EBG module opposite the second side of the package module.

4. Microwave antenna apparatus as claimed in claim 3,
wherein the EBG area has at least the same size as the antenna area.

5. Microwave antenna apparatus as claimed in claim 3,
wherein the EBG module comprises a ground layer arranged on the first surface of the EBG module around the EBG area.

6. Microwave antenna apparatus as claimed in claim 2,
wherein the one or more EBG cells are mushroom type EBG cells, uni-planar type EBG cells, polarization dependent EBG cells, compact spiral EBG cells, stacked EBG cells, miniaturized EBG cells, or inter-digital capacitor EBG cells.

7. Microwave antenna apparatus as claimed in claim 1,
wherein the EBG module comprises an EBG substrate layer, one or more EBG patches arranged on a first surface of the EBG substrate layer facing the second surface of the package module, and further comprising one or more solder ball pads between the first surface of the EBG substrate layer and the second surface of the package module, the one or more solder balls contacting a respective one of the one or more EBG conductive patches.

8. Microwave antenna apparatus as claimed in claim 7,
wherein the EBG module comprises an EBG ground layer arranged on a second surface of the EBG substrate layer opposite the first surface of the EBG substrate layer and EBG vias connecting the EBG patches with the EBG ground layer and connecting the solder ball pads with the EBG ground layer.

9. Microwave antenna apparatus as claimed in claim 7,
wherein the EBG module comprises a feed line arranged on the first surface of the EBG substrate layer, a connection line on an inner layer of the EBG module, and vias connecting the feed line with the connection line and connecting the connection line with the one or more solder ball pads.

10. Microwave antenna apparatus as claimed in claim 7,
wherein the EBG module further comprises a metal plane arranged within the EBG substrate layer and EBG vias connecting the one or more EBG patches with the metal plane.

11. Microwave antenna apparatus as claimed in claim 1,
wherein the package module comprises
a semiconductor package module including a mold layer, the chip, a electrical coupler, and the redistribution layer, and
an antenna module for the antenna mounted on top of the semiconductor package module including an antenna substrate, one or more antenna elements, an antenna feed layer and an antenna ground layer.

12. Microwave antenna apparatus as claimed in claim 1,
wherein the package module comprises
a mold layer, wherein the chip is arranged within the mold layer,
a coupler arranged within the mold layer, one or more antenna elements of the antenna arranged on a first surface of the mold layer facing away from the EBG module, and the redistribution layer arranged on second surface of the mold layer opposite the first surface.

13. Microwave antenna apparatus as claimed in claim 2, wherein in predetermined areas of the EBG module no EBG cells are arranged.

14. Microwave antenna apparatus as claimed in claim 13, wherein said predetermined areas of the EBG module are arranged symmetrically with respect to the antenna.

15. Microwave antenna apparatus as claimed in claim 13, wherein in said predetermined areas DC lines and IF transitions are arranged.

16. Microwave antenna apparatus as claimed in claim 1, wherein the EBG module is coupled to the redistribution layer of the package module via solder balls or pins.

17. Microwave antenna apparatus as claimed in claim 1, wherein the redistribution layer comprises one or more redistribution layers.

18. Microwave antenna apparatus as claimed in claim 1, wherein the EBG module includes conductive patches on the first surface of the EBG module connected to a ground plane on a second surface of the EBG module.

19. Microwave antenna apparatus as claimed in claim 1, wherein the chip is between the first side and the second side of the package module.

\* \* \* \* \*